(12) United States Patent
Steinhoff et al.

(10) Patent No.: US 9,019,670 B2
(45) Date of Patent: Apr. 28, 2015

(54) BI-DIRECTIONAL ESD PROTECTION CIRCUIT

(71) Applicant: Texas Instruments Incorporated, Dallas, TX (US)

(72) Inventors: Robert Steinhoff, Santa Clara, CA (US); Jonathan Brodsky, Richardson, TX (US); Thomas A. Vrotsos, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 125 days.

(21) Appl. No.: 13/751,375

(22) Filed: Jan. 28, 2013

(65) Prior Publication Data

US 2014/0211347 A1    Jul. 31, 2014

Related U.S. Application Data

(62) Division of application No. 09/498,677, filed on Feb. 7, 2000, now Pat. No. 8,384,127.

(60) Provisional application No. 60/164,680, filed on Nov. 10, 1999.

(51) Int. Cl.
  *H02H 3/22*  (2006.01)
  *H02H 3/20*  (2006.01)
  *H01L 27/02*  (2006.01)

(52) U.S. Cl.
  CPC .............. *H02H 3/20* (2013.01); *H01L 27/0274* (2013.01)

(58) Field of Classification Search
  USPC .................................................. 361/56, 111
  See application file for complete search history.

(56) References Cited

U.S. PATENT DOCUMENTS

| 4,750,078 | A   | * | 6/1988  | Ganger et al. ................. 361/56 |
|-----------|-----|---|---------|---------------------------------------|
| 5,976,921 | A   |   | 11/1999 | Maeda                                 |
| 6,060,752 | A   |   | 5/2000  | Williams                              |
| 6,369,427 | B1  |   | 4/2002  | Williamson                            |
| 7,683,426 | B2  | * | 3/2010  | Williams et al. ............. 257/335 |
| 8,514,535 | B2  | * | 8/2013  | Gauthier et al. ................ 361/56 |
| 2009/0261883 | A1 | * | 10/2009 | Bobde ........................... 327/310 |

OTHER PUBLICATIONS

"ESD Protection for Mixed-Voltage I/O Using NMOS Transistors Stacked in a Cascode Configuration", Warren R. Anderson, et al., Electrical Overstress/Electrostatic Discharge Symposium, Oct. 6-8, 1998, pp. 54-62.

* cited by examiner

*Primary Examiner* — Danny Nguyen
(74) *Attorney, Agent, or Firm* — Ronald O. Neerings; Frank D. Cimino

(57) ABSTRACT

A structure is designed with an external terminal (100) and a reference terminal (102). A first transistor (106) is formed on a substrate. The first transistor has a current path coupled between the external terminal and the reference terminal. A second transistor (118) has a current path coupled between the external terminal and the substrate. A third transistor (120) has a current path coupled between the substrate and the reference terminal.

12 Claims, 4 Drawing Sheets

BI-DIRECTIONAL ESD PROTECTION CIRCUIT

This application is a divisional of prior application Ser. No. 09/498,677, filed Feb. 7, 2000, which claims priority under 35 U.S.C. §119(e)(1) of provisional application No. 60/164,680, filed Nov. 10, 1999.

FIELD OF THE INVENTION

This invention relates to an integrated circuit and more particularly to a bi-directional protection circuit.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A typical circuit used to determine sensitivity of the semiconductor circuit to human handling includes a capacitor and resistor that emulate a human body resistor-capacitor (RC) time constant. The capacitor is preferably 100 pF, and the resistor is preferably 1500Ω, thereby providing a 150-nanosecond time constant. A semiconductor device is connected to the test circuit at a predetermined external terminal for a selected test pin combination. In operation, the capacitor is initially charged to a predetermined stress voltage and discharged through the resistor and the semiconductor device. This predetermined stress voltage preferably includes both positive and negative stress voltages with respect to a reference pin or terminal. A post stress current-voltage measurement determines whether the semiconductor device is damaged. Although this test effectively emulates electrostatic discharge from a human body, it fails to comprehend other common forms of electrostatic discharge.

A charged-device ESD test is another common test method for testing semiconductor device sensitivity. This method is typically used to determine sensitivity of the semiconductor circuit to ESD under automated manufacturing conditions. The test circuit includes a stress voltage supply connected in series with a current limiting resistor. The semiconductor device forms a capacitor above a ground plane that is typically 1-2 pF. A low impedance conductor forms a discharge path having an RC time constant typically two orders of magnitude less than a human body model ESD tester. In operation, the semiconductor device is initially charged with respect to the ground plane to a predetermined stress voltage. The semiconductor device is then discharged at a selected terminal through the low impedance conductor. This connection produces a high-voltage, high-current discharge in which a magnitude of the initial voltage across the semiconductor device approaches that of the initial stress voltage.

A particular protection circuit design problem arises when protection circuits are connected to an external terminal that receives both positive and negative voltages with respect to a reference terminal such as $V_{SS}$ during normal circuit operation. Many analog and mixed signal circuits must accommodate such positive and negative signal voltage swings. These signal voltage swings will turn on conventional transistors during normal circuit operation. These positive and negative voltage swings, therefore, preclude a use of many conventional protection circuit devices. Furthermore, the protection circuits of analog and mixed signal circuits must conduct current in a low impedance state in response to an external ESD pulse. They must also remain in a high impedance state during normal circuit operation, and they must protect against positive and negative ESD pulses outside of normal operating parameters as well.

Referring now to FIG. 4, there is a dual silicon-controlled-rectifier (SCR) circuit of the prior art. This dual SCR circuit includes SCR circuits 406 and 408 connected between external terminal or bond pad 400 and reference terminal 410. The SCR circuits are arranged in parallel with opposite polarities. Thus, SCR 406 has an anode connected to external terminal 400 and a cathode connected to reference terminal 410 to conduct in response to positive ESD pulses at external terminal 400. SCR 408 has a cathode connected to external terminal 400 and an anode connected to reference terminal 410 to conduct in response to negative ESD pulses at external terminal 400. These circuits offer limited flexibility in adjustment of trigger voltage thresholds. They are typically activated by a PN junction avalanche threshold voltage in response to a relatively high voltage ESD pulse. This high voltage ESD pulse may damage thin oxide devices in protected circuit 404 prior to activating either SCR. These circuits have a further disadvantage that two of them are required for bi-directional operation in response to both polarities of ESD stress.

SUMMARY OF THE INVENTION

These problems are resolved by a structure with an external terminal and a reference terminal. The structure includes a first transistor formed on a substrate. The first transistor has a current path coupled between the external terminal and the reference terminal. A second transistor has a current path coupled between the external terminal and the substrate. A third transistor has a current path coupled between the substrate and the reference terminal.

The present invention provides bi-directional ESD protection for positive and negative operating voltages. Circuit area is conserved by a single primary protection device.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 1A:
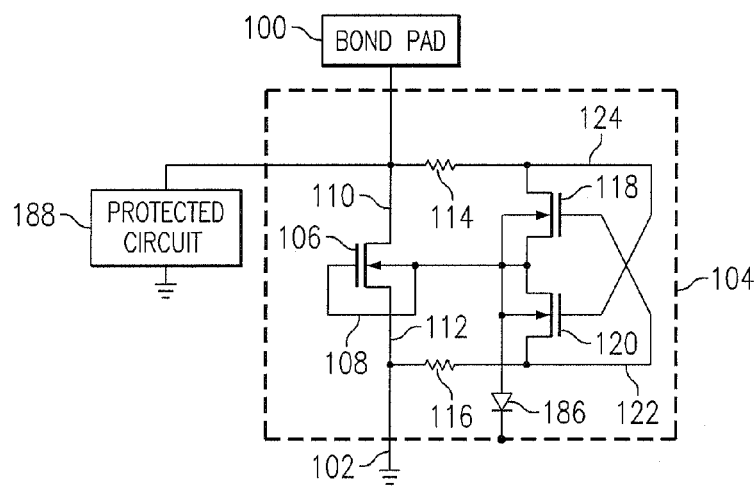
FIG. 1A is a schematic diagram of a protection circuit of the present invention using MOS transistors.

Referring now to FIG. 1A, there is a schematic diagram of a protection circuit of the present invention using a metal oxide semiconductor (MOS) transistor 106 as a primary protection device. This MOS transistor 106 has a current path connected between bond pad or external terminal 100 and reference terminal 102. A control gate of the MOS transistor 106 is coupled to a substrate or bulk terminal via lead 108. The substrate terminal is connected to a common terminal of current paths of MOS transistors 118 and 120. These MOS transistors are preferably about 30 micrometers wide for an on resistance of about 1 k Ω. A resistor 114 couples another end of the current path of transistor 118 to bond pad 100. A similar resistor 116 couples another end of the current path of transistor 120 to reference terminal 102. Both these resistors 114 and 116 are preferably about 1 k Ω each. A control gate of transistor 118 is connected to a common terminal of transistor 120 and resistor 116. Another control gate of transistor 120 is connected to a common terminal of transistor 118 and resistor 114. The bond pad 100 is connected to protected circuit 188.

Figure 1C:
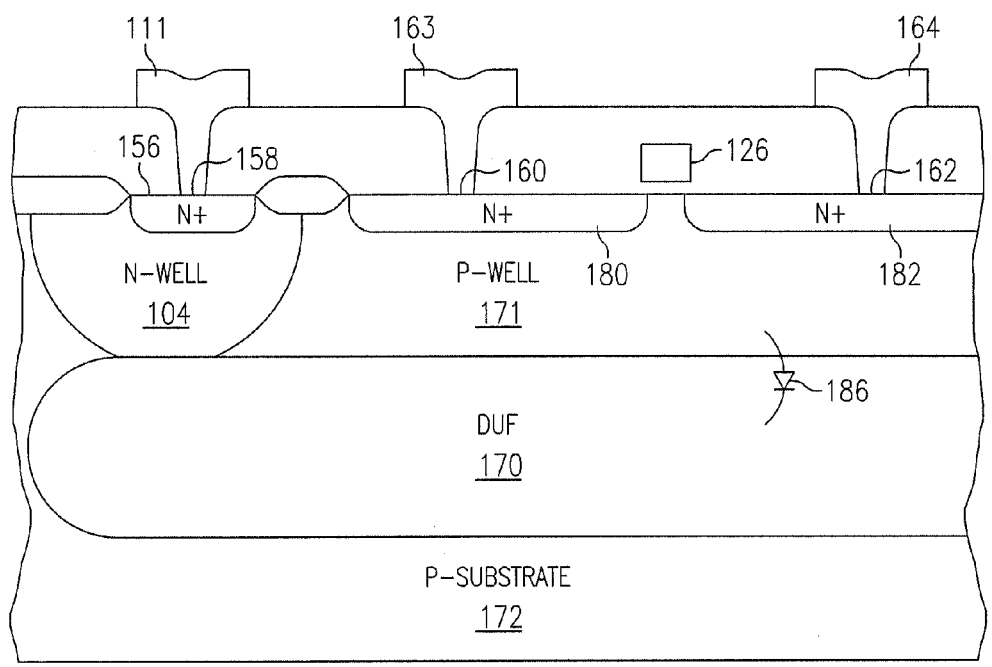
FIG. 1C is a cross section diagram of the protection circuit of FIG. 1B taken at A-A.
Figure 1B:
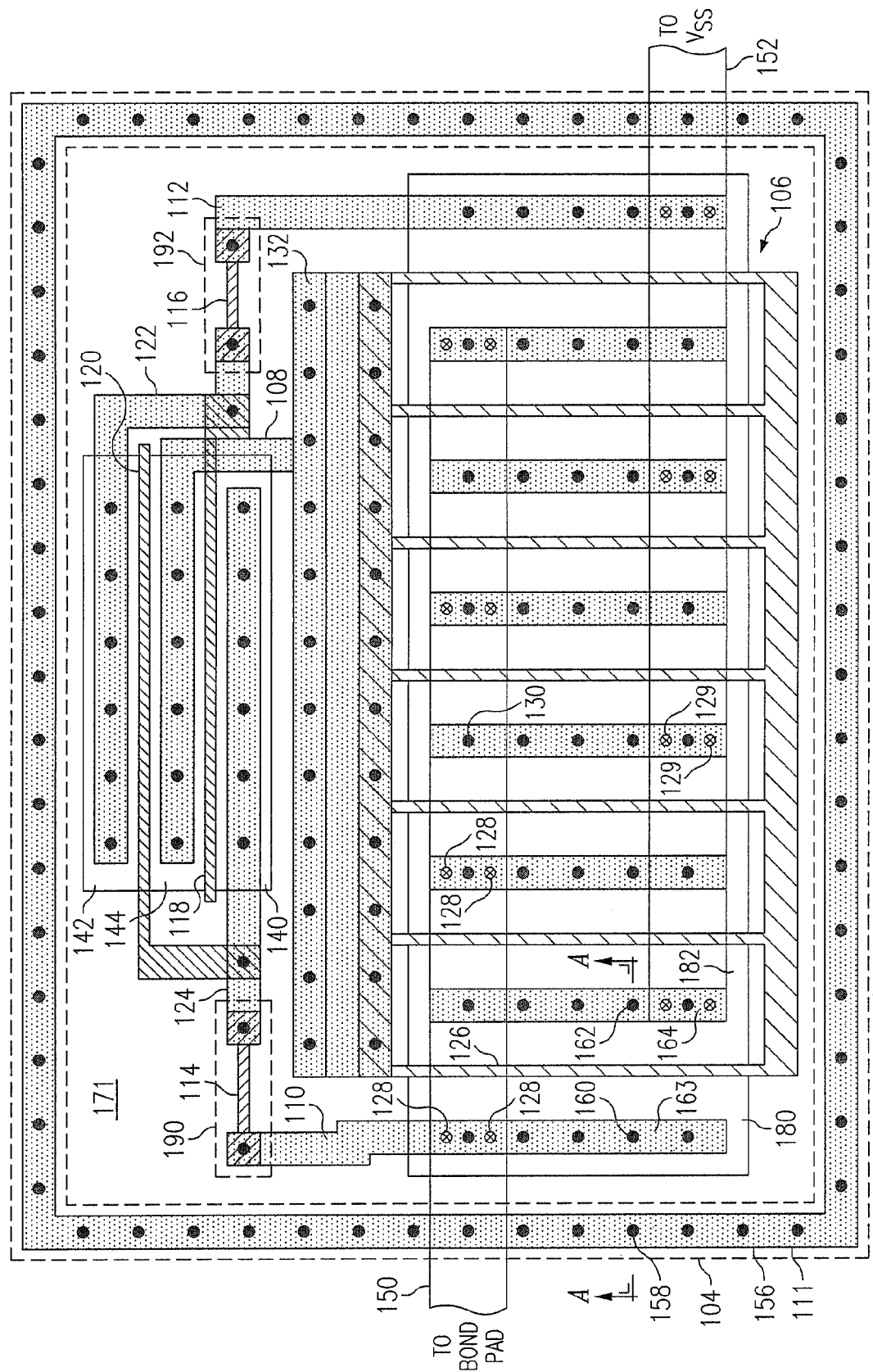
FIG. 1B is a layout diagram of the protection circuit of FIG. 1A.

The layout of the protection circuit of FIG. 1A will now be explained in detail with reference to FIG. 1B and the cross section diagram of FIG. 1C at A-A. Reference numerals of these figures correspond to comparable reference numerals of FIG. 1A. The layout of FIG. 1B includes MOS transistors 106, 118 and 120 formed on P-substrate 172 within lightly doped P-well region 171. A heavily doped N+ diffusion under field (DUF) 170 underlies the P-well region 171. This DUF 170 is preferably about 4-6 micrometers thick and about 3-4 micrometers below the silicon substrate surface. The P-well region 171 is enclosed by lightly doped N-well region 104. This N-well region 104 extends from a face into the substrate to make electrical contact with the underlying DUF 170, thereby electrically isolating P-well region 171 from the rest of the P-substrate 172. The N-well region 104 indicated by the dashed line (FIG. 1A) is electrically contacted by N+ doped region 156 and overlying first metal stripe 111 designated by a dotted fill pattern. This N+ doped region is preferably 0.3-0.4 micrometers thick. The N+ doped region 156 and first metal stripe 111 are electrically connected by contact areas 158 designated by a solid fill pattern. The metal stripe 111 is preferably connected to a positive supply voltage terminal.

The MOS transistor 106 includes plural alternating drain 180 and source regions 182 with intervening control gate regions 126. Common drain and source regions are connected to respective first metal stripes 163 and 164 by contacts 160 and 162. Each first metal drain stripe is connected to a second metal bus 150 by vias 128 indicated by a cross fill pattern. The second metal bus 150 is further connected to the bond pad or external terminal 100. Each first metal source stripe is connected to a second metal bus 152 by vias 129 and to $V_{SS}$ reference supply terminal 102. The control gate 126 of MOS transistor 106 is connected to P+ region 132 by first metal 108 and respective contacts. This P+ region 132 electrically connects the control gate 126 to the P-well region 171. First metal region 108 further connects P+ region 132 to N+ region 144 at a common current path terminal between transistors 118 and 120. The current path terminal 142 of transistor 120 is connected by first metal lead 122 to polycrystalline silicon resistor 116 and to the control gate of transistor 118. Polycrystalline silicon resistor 116 is further connected and to reference terminal 152 by lead 112. The current path terminal 140 of transistor 118 is connected by first metal lead 124 to polycrystalline silicon resistor 114 and to the control gate of transistor 120. Polycrystalline silicon resistor 114 is connected and to bond pad 150 by lead 110.

In normal circuit operation when there is no ESD pulse, the protection circuit, including MOS transistor 106, is designed to remain in a high impedance state. When a voltage at bond pad 100 is more than one MOS transistor threshold voltage ($V_T$) positive with respect to reference terminal 102, transistor 118 is off. The voltage at lead 124, therefore, is the same as at bond pad 100, and transistor 120 is on. In this on state, transistor 120 holds lead 108 to the voltage at reference terminal 102. Thus, transistor 106 remains off. Alternatively, when a voltage at bond pad 100 is more than one $V_T$ negative with respect to reference terminal 102, transistor 120 is off, and transistor 118 is on. In this on state, transistor 118 holds lead 108 to the voltage at bond pad 100. Thus, transistor 106 remains off. The on-resistance of transistors 118 and 120 and respective series resistors 114 and 116 are chosen so that normal signal transitions at bond pad 100 do not capacitively couple more than a diode drop or about 0.7 volts to the common gate-substrate lead 108. In the embodiment of FIG. 1A, resistors 114 and 116 are formed from P+ doped polycrystalline silicon with a silicide blocking layer. The resistance of these resistors and the on resistance of each of transistors 118 and 120, therefore, is preferably about 1 k Ω each.

During ESD operation, application of a positive ESD pulse to bond pad 100 with respect to reference terminal 102 capacitively couples a positive voltage via parasitic gate-drain capacitance (not shown) of transistor 106 to lead 108. The positive transition of lead 108 increases the voltage at P-well region 171 through P+ doped region 132. This positive voltage at leads 110 and 108 initiates a transition of the parasitic NPN bipolar transistor of MOS transistor 106 from $BV_{CBO}$ (open emitter collector-base breakdown voltage) to $BV_{CEO}$ (open base collector-emitter breakdown) or snapback. In snapback, MOS transistor 106, including the parasitic NPN transistor, conduct the ESD current from bond pad 100 to reference terminal 102, thereby preventing an excessive voltage increase that might otherwise damage protected circuit 188. The ESD pulse at bond pad 100 also couples a voltage to lead 124 and turns on transistor 120. The on resistance of transistor 120 together with the series resistance of resistor 116, however, provide a relatively slow discharge of the gate capacitance of MOS transistor 106. The voltage coupled to lead 108, therefore, is not effectively discharged by transistor 120 until most of the ESD current has been discharged.

Application of a negative ESD pulse to bond pad 100 with respect to reference terminal 102 has the same effect as application of a positive ESD pulse to reference terminal 102 with respect to bond pad 100. Furthermore, due to symmetry of the circuit of FIG. 1A and isolation of the P-well region 171 from P-substrate 172, the protection circuit operates as previously described except for a change of polarity. The negative ESD pulse capacitively couples a negative voltage via parasitic gate-drain capacitance of transistor 106 to lead 108. The negative transition of lead 108 decreases the voltage at P-well region 171 through P+ doped region 132. This negative voltage at leads 110 and 108 initiates a transition of the parasitic NPN bipolar transistor of MOS transistor 106 from $BV_{CBO}$ to $BV_{CEO}$ or snapback. In snapback, MOS transistor 106, including the parasitic NPN transistor, conduct the ESD current from reference terminal 102 to bond pad 100. The ESD pulse at bond pad 100 also couples a negative voltage to lead 124 and turns on transistor 118. The on resistance of transistor 118 together with the series resistance of resistor 114 provide a relatively slow discharge of the gate capacitance of MOS transistor 106. The voltage coupled to lead 108, therefore, is not effectively discharged by transistor 118 until most of the ESD current has been discharged.

This circuit is highly advantageous in providing ESD protection against both positive and negative ESD stress pulses. This bi-directional operation provides this ESD protection with a single MOS transistor 106 as a primary protection device. This single device conserves layout area and minimizes circuitry adjacent the bond pad. A further advantage of the present invention is the compatibility with both positive and negative signal voltages at bond pad 100 during normal operation. For either polarity of signal voltage, the protection circuit, including MOS transistor 106, remains in a high impedance or nonconducting state during normal circuit operation.

Figure 2A:
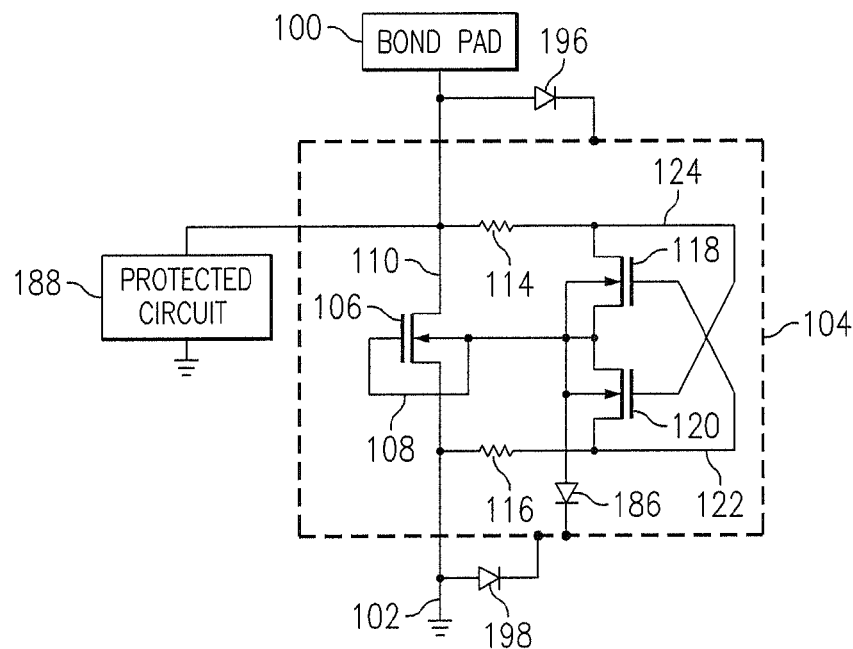
FIG. 2A is a schematic diagram of another embodiment of the protection circuit of the present invention.

Referring now to FIG. 2A, there is a schematic diagram of another embodiment of the protection circuit of the present invention and a corresponding layout diagram (FIG. 2A). This embodiment is the same as the protection circuit of FIG. 1A except for the addition of diodes 196 and 198. These diodes are formed by the addition of P+ heavily doped regions respectively designated 196 and 198 within N-well region 104. These diodes 196 and 198 conduct ESD current to N-well region 104 and DUF region 170 under forward bias during respective positive and negative ESD pulses at bond pad 100. For a positive ESD pulse at bond pad 100, for example, the ESD current increases a voltage at N-well region 104 and DUF region 170 with respect to reference terminal 102. This increased voltage is capacitively coupled to the enclosed P-well region 171 by means of the parasitic junction capacitance (not shown) of reverse biased diode 186. This increase in voltage serves to forward bias the emitter of the parasitic NPN transistor of MOS transistor 106, thereby initiating conduction of the protection circuit. Alternatively, application of a negative ESD pulse at bond pad 100 will decrease the voltage at lead 110 and forward bias the emitter of the parasitic NPN transistor of MOS transistor 106. Under forward bias, the base current of the parasitic NPN transistor will charge the parasitic junction capacitance (not shown) of reverse biased diode 186. Initial conduction of the protection circuit, therefore, is enhanced by diodes 196 and 198 for either polarity of ESD stress pulse. This is highly advantageous in lowering the trigger threshold of the protection circuit, thereby limiting the maximum voltage at protected circuit 188.

Figure 3:
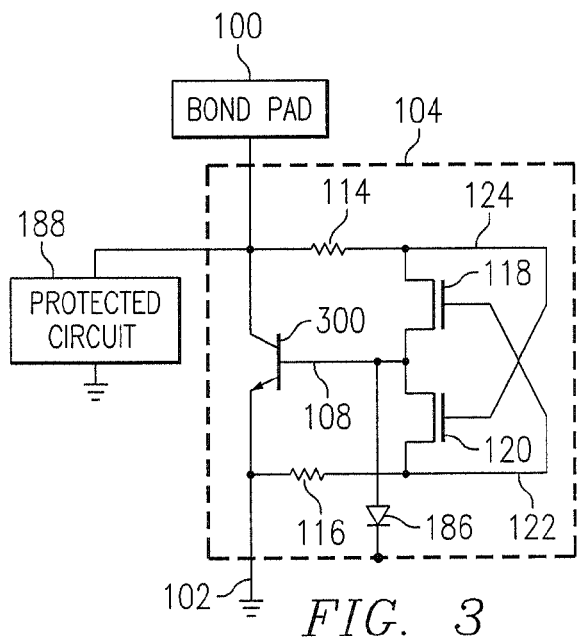
FIG. 3 is a schematic diagram of yet another embodiment of the protection circuit of the present invention.
Figure 4:
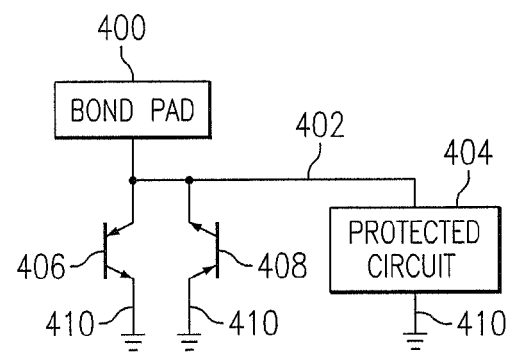
FIG. 4 is a schematic diagram of a bi-directional protection circuit of the prior art.
Figure 2B:
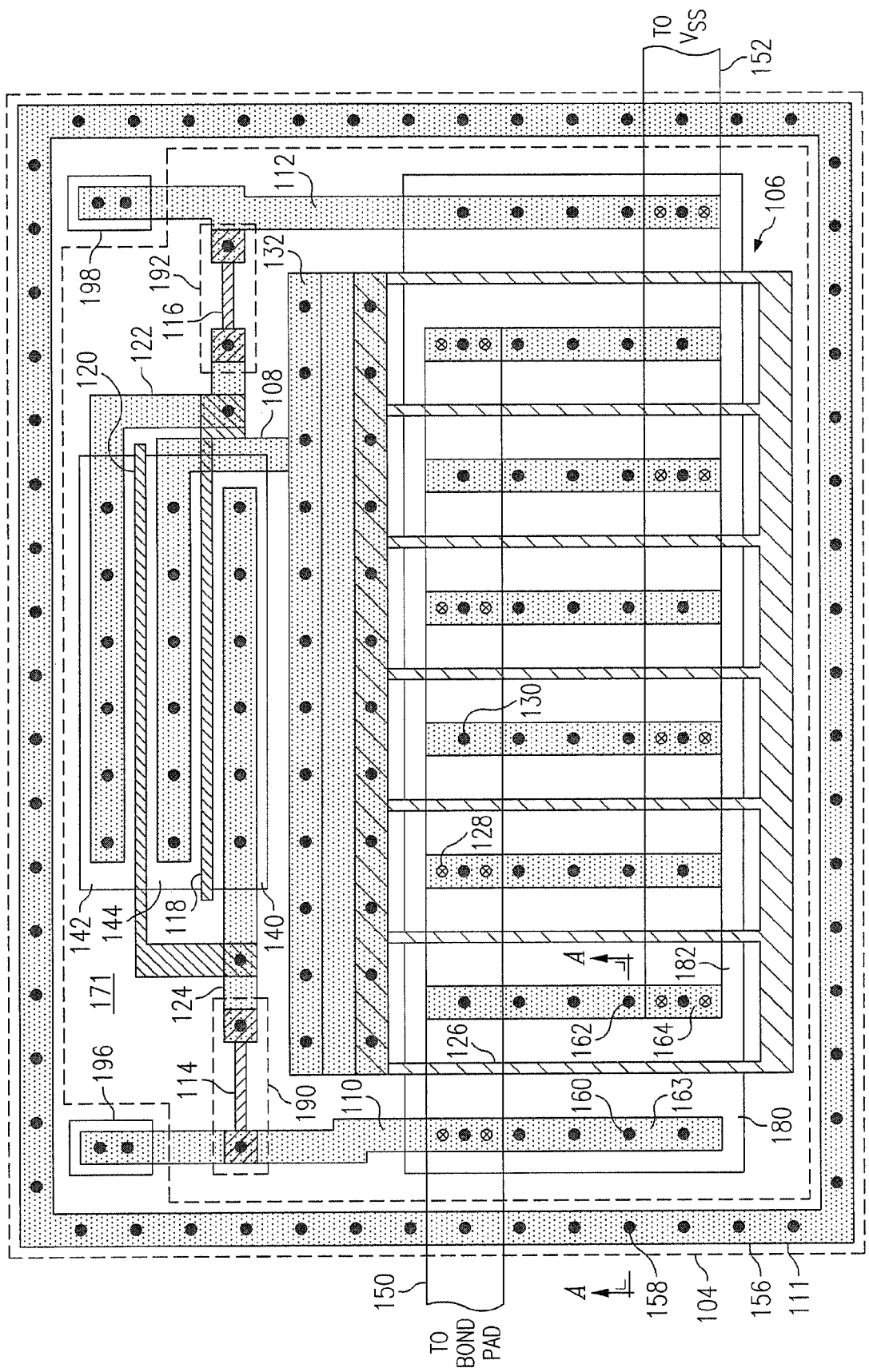
FIG. 2B is a layout diagram of the protection circuit of FIG. 2A.

Turning now to FIG. 3, there is a schematic diagram of yet another embodiment of the protection circuit of the present invention. This embodiment is the same as the embodiment of FIG. 1A, except that NPN bipolar transistor 300 replaces MOS transistor 106. This NPN bipolar transistor 300 may be formed by individual N+ regions 180 and 182 without intervening gate region 126 (FIG. 1A). Operation of the protection circuit is the same as previously described for the parasitic NPN transistor of MOS transistor 106 in previous embodiments. A further advantage of this embodiment, however, is that thin oxide regions are eliminated in the primary protection device. Elimination of these thin oxide regions greatly reduces a likelihood of gate dielectric damage due to rapid ESD transients such as charged device stress.

Although the invention has been described in detail with reference to its preferred embodiments, it is to be understood that this description is by way of example only and is not to be construed in a limiting sense. For example, various combinations of resistors and transistors of the previous embodiments may be combined to provide the advantages of the present invention as will be appreciated by one of ordinary skill in the art having access to the instant specification. In particular, the embodiment of FIG. 3 may readily be combined with diodes 196 and 198 of the embodiment of FIG. 2A. Furthermore, the inventive concept of the present invention may be advantageously extended to many parallel transistors 106 or 300 in a semiconductor body without current hogging.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed is:

1. A method of forming a circuit comprising:
   forming a first device having a current path and a control terminal between an external terminal and a reference terminal, the external terminal coupled to receive a maximum positive voltage with respect to the reference terminal and a minimum negative voltage with respect to the reference terminal during normal circuit operation;
   forming a second device having a current path connected to the control terminal of the first transistor, the second device arranged to inhibit conduction of the current path of the first device in response to the maximum positive voltage;
   forming a third device having a current path connected to the control terminal of the first transistor, the third device arranged to inhibit conduction of the current path of the first device in response to the minimum negative voltage;
   connecting a first resistor between the external terminal and the current path of the second device; and
   connecting a second resistor between the current path of the third device and the reference terminal.

2. A method of forming a circuit comprising:
   forming a first device having a current path and a control terminal between an external terminal and a reference terminal, the external terminal coupled to receive a maximum positive voltage with respect to the reference terminal and a minimum negative voltage with respect to the reference terminal during normal circuit operation;
   forming a second device having a current path connected to the control terminal of the first transistor, the second device arranged to inhibit conduction of the current path of the first device in response to the maximum positive voltage;
   forming a third device having a current path connected to the control terminal of the first transistor, the third device arranged to inhibit conduction of the current path of the first device in response to the minimum negative voltage;
   forming a first lightly doped region having a first conductivity type and underlying the first device;
   forming a first heavily doped region having a second conductivity type and underlying the first lightly doped region; and
   forming a second lightly doped region having the second conductivity type, the second lightly doped region extending from a face of the first lightly doped region to the first heavily doped region.

3. A method as in claim 2, further comprising:
   forming a first diode coupled between the external terminal and the second lightly doped region; and
   forming a second diode coupled between the reference terminal and the second lightly doped region.

4. A method as in claim 2, further comprising connecting the control terminal of the first device to the first lightly doped region.

5. A method as in claim 4, further comprising connecting a protected circuit to the external circuit.

6. A method as in claim 5, wherein the first device is a bipolar transistor and wherein the first lightly doped region comprises a base terminal of the bipolar transistor.

7. An apparatus, comprising:
   a first device having a current path and a control terminal between an external terminal and a reference terminal, the external terminal coupled to receive a maximum positive voltage with respect to the reference terminal and a minimum negative voltage with respect to the reference terminal during normal circuit operation;
   a second device having a current path connected to the control terminal of the first transistor, the second device arranged to inhibit conduction of the current path of the first device in response to the maximum positive voltage;
   a third device having a current path connected to the control terminal of the first transistor, the third device arranged to inhibit conduction of the current path of the first device in response to the minimum negative voltage;
   a first resistor connecting the external terminal to the current path of the second device; and
   a second resistor connecting the current path of the third device to the reference terminal.

8. An apparatus, comprising:
   a first device having a current path and a control terminal between an external terminal and a reference terminal, the external terminal coupled to receive a maximum positive voltage with respect to the reference terminal and a minimum negative voltage with respect to the reference terminal during normal circuit operation;
   a second device having a current path connected to the control terminal of the first transistor, the second device arranged to inhibit conduction of the current path of the first device in response to the maximum positive voltage;
   a third device having a current path connected to the control terminal of the first transistor, the third device arranged to inhibit conduction of the current path of the first device in response to the minimum negative voltage;
   a first lightly doped region having a first conductivity type and underlying the first device;
   a first heavily doped region having a second conductivity type and underlying the first lightly doped region; and
   a second lightly doped region having the second conductivity type, the second lightly doped region extending from a face of the first lightly doped region to the first heavily doped region.

9. The apparatus of claim 8, further comprising:
   a first diode coupling the external terminal to the second lightly doped region; and
   a second diode coupling the reference terminal to the second lightly doped region.

10. The apparatus of claim 8, further comprising the control terminal of the first device coupled to the first lightly doped region.

11. The apparatus of claim 4, further comprising a protected circuit coupled to the external circuit.

12. The apparatus of claim 11, wherein the first device is a bipolar transistor and wherein the first lightly doped region comprises a base terminal of the bipolar transistor.

* * * * *